(12) United States Patent
Datta et al.

(10) Patent No.: US 7,642,603 B2
(45) Date of Patent: Jan. 5, 2010

(54) SEMICONDUCTOR DEVICE WITH REDUCED FRINGE CAPACITANCE

(75) Inventors: Suman Datta, Beaverton, OR (US); Titash Rakshit, Hillsboro, OR (US); Jack T. Kavalieros, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 11/823,892

(22) Filed: Jun. 29, 2007

(65) Prior Publication Data

US 2009/0001474 A1    Jan. 1, 2009

(51) Int. Cl.
*H01L 29/76*    (2006.01)
*H01L 29/94*    (2006.01)
*H01L 31/062*    (2006.01)
*H01L 31/113*    (2006.01)
*H01L 31/119*    (2006.01)

(52) U.S. Cl. .............. 257/365; 257/E21.421; 257/E29.264; 438/283; 438/290

(58) Field of Classification Search ............. 257/365, 257/E29.264, E21.421; 438/283, 290
See application file for complete search history.

(56) References Cited

U.S. PATENT DOCUMENTS

| | | | |
|---|---|---|---|
| 7,005,366 B2 | 2/2006 | Chau et al. | 438/591 |
| 7,172,943 B2 * | 2/2007 | Yeo et al. | 438/300 |
| 2006/0286729 A1 | 12/2006 | Kavalieros et al. | 438/183 |
| 2007/0278576 A1 * | 12/2007 | Kim et al. | 257/347 |
| 2008/0003753 A1 * | 1/2008 | Seo et al. | 438/296 |
| 2008/0274600 A1 * | 11/2008 | Mathew et al. | 438/283 |

* cited by examiner

*Primary Examiner*—Phuc T Dang
(74) *Attorney, Agent, or Firm*—Trop, Pruner & Hu, P.C.

(57) ABSTRACT

In one embodiment of the invention, a non-planar transistor includes a gate electrode and multiple fins. A trench contact is coupled to the fins. The contact bottom is formed above the substrate and does not directly contact the substrate. The contact bottom is higher than the gate top.

20 Claims, 2 Drawing Sheets

SEMICONDUCTOR DEVICE WITH REDUCED FRINGE CAPACITANCE

BACKGROUND

Nonplanar, multi-gate, multi-fin transistors may have increased parasitic gate-to-source and gate-to-drain fringe capacitance as compared to planar transistors. Gate-to-source capacitance and gate-to-drain capacitance may be due to inversion channel capacitance and parasitic gate-to-source capacitance. Additionally, another source of fringe capacitance may arise from the overlap between the gate electrode and the source and/or drain contacts. This fringe capacitance may be significant in the "dead space" area located between the fins of the transistor. This increased capacitance may affect performance (e.g., switching speed) of the transistor.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

Figure 1A:
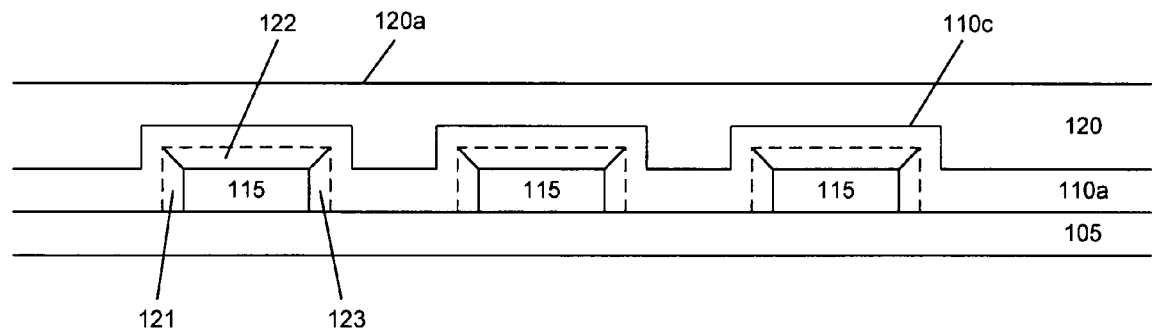
FIG. 1a is a side cross-section view taken along the line A-A of the transistor in FIG. 1b.
Figure 1B:
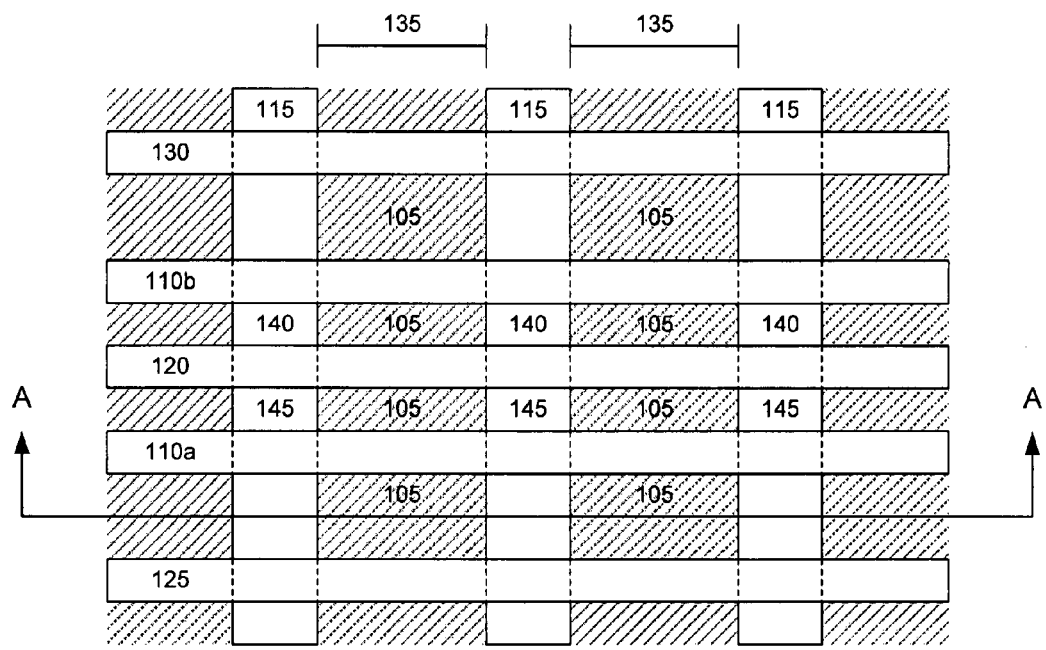
FIG. 1b is a top view of a nonplanar, multi-gate, multi-fin transistor.

FIG. 1b is a top view of a traditional nonplanar, multi-gate, multi-fin transistor 100. FIG. 1a is a view taken along the line A-A in FIG. 1b. Regarding FIG. 1a, the transistor includes a gate electrode 120, substrate 105, multiple fins 115, and a transistor terminal or node (e.g., source or drain) trench contact 110a. Multiple gates 121, 122, 123 at least partially surround the fins 115 where the fins are coupled to the gate electrode 120. In between the fins 115 lies the "dead space" 135. Within the dead space, the terminal contact 110a directly contacts the substrate 105. The top 120a of the gate electrode 120 may be higher than the top 110c of the terminal contact 110a. In FIG. 1b, multiple gate electrodes 120, 125, 130 are formed among terminal contacts 110a, 110b and fins 115. The fins may be doped to create, for example, source 140 and drain 145 regions.

Multi-gate, multi-fin transistor 100 may have increased parasitic capacitance. In FIG. 1a, the increased capacitance may be due in part to fringe capacitance in the dead space arising from the overlap in a horizontal plane between the gate electrode 120 and the terminal contact 110a. The terminal contact top 110c is formed below the gate electrode top 120 and above the gate electrode bottom/substrate interface, thus creating the aforementioned overlap and fringe capacitance.

Figure 2:
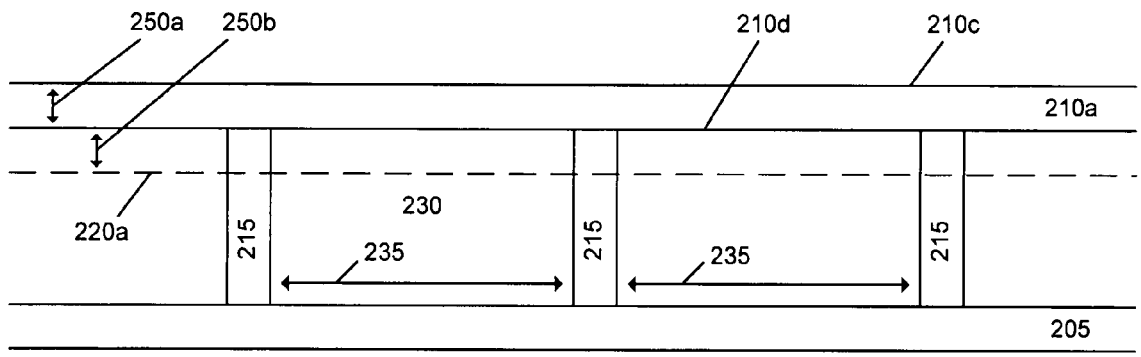
FIG. 2 is a side cross-section view of a transistor in one embodiment of the invention.

In contrast, in one embodiment of the invention depicted in FIG. 2, the problematic overlap is reduced or removed entirely. FIG. 2 is a view similar to that of FIG. 1a as it is a side cross-section of a non-planar transistor looking immediately towards a transistor contact. The transistor 200 includes a gate electrode with a gate electrode top 220a and a gate electrode bottom at the gate electrode and substrate 205 interface. The transistor also includes substrate 205, multiple fins 215, and a transistor terminal trench contact 210a. In the dead space 235 between the fins 215, the terminal contact 210a does not directly contact the substrate 205 in one embodiment of the invention. For example, the trench contact etch never reaches the bottom of the fin. Instead, the trench contact 210a and fins 215 are raised. More specifically, the top 220a of the gate electrode 220 is lower than the top 210c of the terminal trench contact 210a and the bottom 210d of the terminal trench contact 210a. An insulative material 230 may be located between the terminal contact bottom 210d and the substrate 205. The insulative material 230 may support the elevated contact 210a. Thus, a portion 250a of the contact 210a is nonoverlapping in the horizontal plane with the gate electrode located between the gate electrode top 220a and the substrate 205. In one embodiment of the invention, a distance 250b separates the contact bottom 210d from the gate electrode top 220a. Thus, parasitic capacitance may be reduced. In addition, parasitic capacitance in the "dead space" 235 may be reduced as compared to traditional nonplanar transistors.

Figure 3:
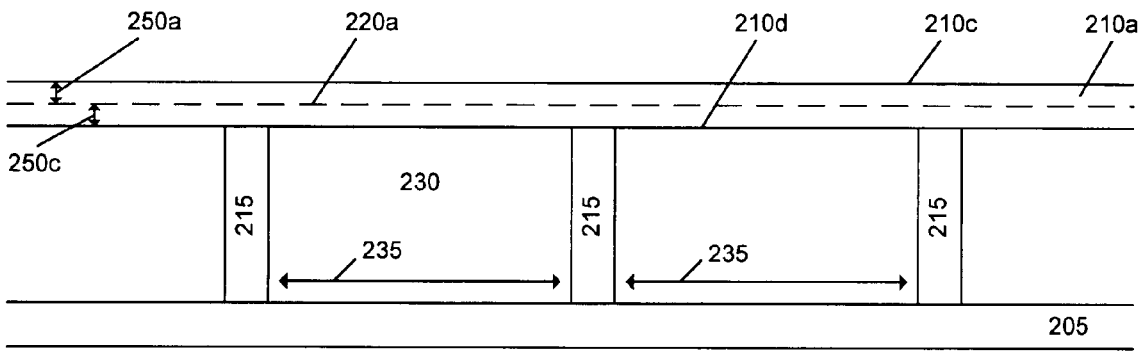
FIG. 3 is a side cross-section view of a transistor in one embodiment of the invention.

FIG. 3 is a cross-section side view of a transistor 300 in one embodiment of the invention. In contrast to FIG. 2, the contact bottom 210d is elevated but is not above gate electrode top 220a. Thus, a nonoverlapping region 250a and diminished overlapping region 250c exist between the contact 210a and gate electrode top 220a. Thus, due in part to the reduced overlapping region, parasitic capacitance may be reduced as compared to traditional nonplanar transistors.

In one embodiment of the invention, the gate electrode height is minimized based upon governing design rules and desired gate resistance. This lowering of the gate electrode may decrease or remove overlapping regions between elevated transistor terminal contacts and the minimized or lowered gate electrode. In one embodiment of the invention, the fins 215 and specifically the doped source and/or drain regions of the fins 215 are elevated, which in turn elevates the contact. In one embodiment of the invention, the fins 215 may have only portions thereof (e.g., a doped region) that are heightened whereas other portions (e.g., gate interface) are lower. In one embodiment of the invention, a transistor contact couples a fin by way of a via formed in an insulation layer formed between the fin and the contact.

Thus, as seen in FIG. 2, a non-planar transistor 200 may include a gate electrode that includes a gate electrode top 220a and a gate electrode bottom (not shown) coupled to a substrate 205. A fin 215 is coupled to the gate electrode 220 and, in one embodiment of the invention, a drain region and a source region that are doped regions of the fins. One or more additional fins may be included in a transistor in a similar manner. A trench contact 210 may be coupled to the fins 215, the trench contact including a contact top 210c and a contact bottom 210d. The contact bottom 210d may be formed above the substrate 205 and not in direct contact to the substrate. The contact bottom for either or both the source contact and the drain contact may be so elevated.

In one embodiment of the invention, the contact bottom is planar and does not undulate. In contrast, in another embodiment of the invention the contact bottom undulates and dips, for example, in between fins. The undulating bottom may still produce a decreased overlap with the gate electrode, as compared to traditional non-planar devices, and consequently decrease fringe capacitance.

In one embodiment of the invention, a transistor node (e.g., source or drain) top may be elevated to the point that the node top is formed at or higher than the gate electrode top. As a result, the entire transistor node contact may be formed at or higher than the gate electrode top.

A method of fabricating a multi-gate, multi-fin nonplanar transistor in accordance with embodiments of the present invention will now be described. The fabrication of, for example, a tri-gate transistor begins with a substrate. A silicon or semiconductor film may be formed on the substrate. The substrate may be an insulating substrate that may include a lower monocrystalline silicon substrate and a top insulating layer, such as a silicon dioxide film or silicon nitride film. An insulating layer may isolate the semiconductor film from the substrate, and in one embodiment is formed to a thickness between 200-2000 Å. When a silicon or semiconductor film is formed on an insulating substrate, a silicon or semiconductor on insulating (SOI) substrate is created. In other embodiments of the present invention, the substrate can be a semiconductor substrate, such as but not limited to a silicon monocrystalline substrate and a gallium arsenide substrate.

Although semiconductor film is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, as well as carbon nanotubes. In an embodiment of the present invention, the semiconductor film is an intrinsic (i.e., undoped) silicon film. In other embodiments, the semiconductor film is doped to a p type or n type conductivity with a concentration level between $1\times10^{16}$-$1\times10^{19}$ atoms/$cm^3$. The semiconductor film can be insitu doped or doped after it is formed on the substrate by, for example, ion-implantation.

The semiconductor film is formed to a thickness which is approximately equal to the height desired for the subsequently formed semiconductor bodies or fins of the fabricated tri-gate transistor. In an embodiment of the present invention, semiconductor film has a thickness or height of less than 30 nanometers and ideally less than 20 nanometers. However, as stated above, portions of the fin may be heightened in comparison to the gate electrode to reduce horizontal overlap between a transistor contact and the gate electrode. In an embodiment of the present invention, the semiconductor film is formed to the thickness approximately equal to the gate "length" desired of the fabricated tri-gate transistor. In an embodiment of the present invention, the semiconductor film is formed thicker than desired gate length of the device.

Semiconductor film can be formed on an insulating substrate in any well-known method. Well-known smoothing techniques, such as HC smoothing or chemical mechanical polishing (CMP) can be used to smooth the top surface of the semiconductor film to its desired thickness. Isolation regions can be formed into the SOI substrate in order to isolate the various transistors to be formed therein from one another. Isolation regions can be formed by etching away portions of the substrate film surrounding a tri-gate transistor, by well-known photolithographic and etching techniques, and then back filling the etched regions with an insulating film, such as $SiO_2$.

In order to form a tri-gate transistor on the substrate, a photoresist mask is formed on the semiconductor film. The photoresist mask contains a pattern defining locations where semiconductor bodies or fins will be subsequently formed in the semiconductor film. In an embodiment of the present invention, the pattern defines fins or bodies having a width which is equal to or greater than the width desired of the gate length of the fabricated transistor. In an embodiment of the present invention, the semiconductor bodies or fins will have a width less than or equal to 30 nanometers. In an embodiment of the present invention, the patterns for the semiconductor bodies or fins have a width approximately equal to the silicon body height. In an embodiment of the present invention, the photoresist patterns have a width which is between the semiconductor body or fin height and two times the semiconductor body or fin height.

Additionally, the photoresist mask can also include patterns for defining locations where source landing pads and drain landing pads, respectively, are to be formed. The landing pads can be used to connect together the various source regions and to connect together the various drain regions of the fabricated transistor. The photoresist mask can be formed by well-known photolithographic techniques including masking, exposing, and developing a blanket deposited photoresist film.

After forming photoresist mask, the semiconductor film is etched to form one or more silicon bodies or fins and source and drain landing pads (if desired). The semiconductor film is etched until an underlying buried oxide layer is exposed. Well-known semiconductor etching techniques, such as anisotropic plasma etching or reactive ion etching can be used to etch the semiconductor film in alignment with mask.

After the semiconductor film is etched to form semiconductor bodies or fins, the photoresist mask is removed by well-known techniques, such as by chemical stripping and $O_2$ ashing.

Next, a gate dielectric layer is formed on and around each semiconductor body. The gate dielectric can be a deposited dielectric or a grown dielectric. In an embodiment of the present invention, the gate dielectric layer is a silicon dioxide dielectric film grown with a dry/wet oxidation process. In an embodiment of the present invention, the silicon oxide film is grown to a thickness of between 5-15 Å. In an embodiment of the present invention, the gate dielectric film is a deposited dielectric, such as but not limited to a high dielectric constant film, such as metal oxide dielectric, such as tantalum pentaoxide ($Ta_2O_5$) and titanium oxide (TiO) or other high-K dielectrics, such as PZT and BST. A high dielectric constant film can be formed by any well-known technique, such as by chemical vapor deposition (CVD).

Next, a gate electrode is formed. The gate electrode is formed on the gate dielectric layer formed on the top surface of each of the semiconductor bodies and is formed on or adjacent to the gate dielectric formed on or adjacent to the sidewalls of each of the semiconductor bodies. The gate electrode has a top surface and has a pair of laterally opposite sidewalls. The distance between the laterally opposite sidewalls defines the gate length. The gate electrode can be formed by blanket depositing a suitable gate electrode material over the substrate. The gate electrode can be formed to a thickness of, for example, between 200-3000 Å. As stated above, the total gate electrode height above the substrate may be minimized based upon governing design rules and desired gate resistance. Such minimization may decrease overlap with an elevated transistor contact. The gate electrode material is then patterned with well-known photolithography and etching techniques to form gate electrode from the gate electrode material. In embodiment of the present invention, the gate electrode material comprises polycrystalline silicon. In another embodiment of the present invention, the gate electrode material comprises a polycrystalline silicon germanium alloy. In yet other embodiment of the present invention, the gate electrode material can comprise a metal film, such as tungsten, tantalum, and their nitrides. The gate electrode can be formed by well-known techniques, such as by blanket depositing a gate electrode material over the substrate and then patterning the gate electrode material with well-known photolithography and etching techniques. In an embodiment of the present invention, the gate length is less than or equal to 30 nanometers.

Next, source and drain regions for the transistor are formed on the semiconductor fins on opposite sides of the gate electrode. If source and drain landing pads are utilized, they may be doped at this time. For a PMOS tri-gate transistor, the semiconductor fins or bodies are doped to a p type conductivity and to a concentration between $1\times10^{15}$-$1\times10^{20}$ atoms/cm$^3$. For a NMOS tri-gate transistor, the semiconductor fins or bodies may be doped with n type conductivity ions to a concentration between $1\times10^{15}$-$1\times10^{20}$ atoms/cm$^3$. If the gate electrode is a metal electrode, a dielectric hard mask may be used to block the doping during the ion-implantation process. In other embodiments, other methods, such as solid source diffusion, may be used to dope the semiconductor body or fin to form source and drain extensions.

Next, an insulation material (e.g., nitride, oxide) may be deposited and used as a foundation for the formation of silicide on the source/drain contact regions as well as on the gate electrode. As described above, the fins and/or insulation material height may be adjusted to elevate the transistor contacts.

In embodiments of the present invention, dielectric sidewall spacers can be formed on the sidewalls of the gate electrode. Sidewall spacers can be utilized to offset heavy source/drain contact implants, can be used to isolate source/drain regions from the gate electrode during a selective silicon deposition processes and can be used in a salicide process to form silicide on the source and drain regions as well as on the gate electrode. For example, heightened spacers may be used to form tall contacts that have contact tops higher than the gate electrode top. Spacers can be formed by blanket depositing a conformal dielectric film, such as but not limited to silicon nitride, silicon oxide, silicon oxynitride or combination thereof over the substrate. Dielectric film is deposited in a conformal manner so that it forms to substantially equal heights on vertical surfaces, such as sidewalls of the gate electrode as well as on horizontal surfaces, such as on the top of silicon film and the top of gate electrode. In an embodiment of the present invention, the dielectric film is a silicon nitride film formed by a hot wall low-pressure chemical vapor deposition (LPCVD) process. The deposited thickness of the dielectric film determines the width or thickness of the formed spacers. In an embodiment of the present invention, the dielectric film is formed to a thickness between 20-200 Å.

Next, the dielectric film is anisotropically etched by, for example, plasma etching or reactive ion etching to form sidewall spacers. The anisotropic etch of dielectric film removes the dielectric film from horizontal surfaces, such as the top of gate electrode and leaves dielectric sidewall spacers adjacent to vertical surfaces, such as sidewalls of the gate electrode. The etch is continued for a sufficient period of time to remove the dielectric film from all horizontal surfaces. In an embodiment of the present invention, an over etch is utilized so that the spacer material on the sidewalls of the semiconductor bodies is removed. The result is the formation of sidewall spacers which run along and adjacent to sidewalls of the gate electrode.

Next, if desired, a semiconductor film can be formed on the exposed surfaces of the semiconductor body. Additionally, if desired, a semiconductor film can be formed on the top of gate electrode. The semiconductor film can be a single crystalline film or a polycrystalline film. In an embodiment of present invention, semiconductor film is an epitaxial (single crystalline) silicon film. In an embodiment of the present invention, the silicon film is formed by a selective deposition process whereby silicon is formed only on exposed regions which contain silicon, such as the exposed top surface and sidewalls of silicon body/fin. In a selective deposition process the silicon film does not form on dielectric areas, such as sidewall spacers. In an embodiment of present invention, a silicon film is formed to a thickness between 50-500 Å. In an embodiment of the present invention, the silicon film is formed to a thickness sufficient to provide enough silicon to be used or consumed during the formation of a silicide film on the source and drain regions. The silicon film can be insitu doped (i.e., doped during deposition) or subsequently doped by for example ion-implantation or solid source diffusion. The silicon film is doped to the conductivity type desired for the source and drain regions of the device. In an embodiment of the present invention, the deposited silicon film is an intrinsic silicon film (i.e., undoped silicon films). The deposition of semiconductor film may form raised source and drain regions which may improve the parasitics of the device. Again, as discussed at length above, the source and/or drain regions may be elevated so that the future transistor contact bottom is formed above the gate electrode top. In other embodiments of the invention, the overlap between gate electrode and transistor is contact is merely diminished rather than removed entirely.

In an embodiment of the present invention, the deposited silicon film is doped by ion-implantation utilizing a vertical ion-implantation angle. The ion-implantation process dopes the deposited silicon film and the silicon body located underneath to a concentration between $1\times10^{20}$-$1\times10^{21}$ atoms/cm$^3$ to form a source contact region and a drain contact region. Sidewall spacers offset the source/drain contact implantation step and define the tips regions. The above referenced process forms source regions and drain regions which each comprise a tip region and a contact region. The tip region is the region of the silicon body located beneath sidewall spacers. The contact regions are the regions of the silicon body and deposited silicon film which are adjacent to the outside edges of the sidewall spacers. Additionally, the source/drain contact regions include the source and drain landing pads when utilized.

Next, if desired, a refractory metal silicide can be formed on the source and drain contact regions as well as on the top of gate electrode. A refractory metal silicide film can be formed with a self-aligned process, such as a salicide process. In a salicide process a refractory metal film, such as titanium, tungsten, nickel, cobalt or the like is blanket deposited over the substrate. The substrate is then heated to a suitable temperature to cause the refractory metal film to react with silicon portion of substrate, such as silicon film formed on the silicon bodies/fins and silicon film formed on the gate electrodes, in order to form a refractory metal silicide. Locations where silicon is unavailable to react, such as dielectric spacers and exposed portions of buried oxide, do not react and remain as refractory metal. A selective etch, such as a wet etch, can then be utilized to remove the unreacted refractory metal and leave the refractory metal silicide on the contact areas. In this way, a metal silicide film can be self-aligned to the contact regions of a tri-gate transistor. This completes the fabrication of a tri-gate transistor in accordance with the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-planar transistor comprising:
   a gate electrode including a gate electrode top and a gate electrode bottom, the gate electrode bottom coupled to a substrate;
   a first fin coupled to the gate electrode, a first drain, and a first source;
   a second fin coupled to the gate electrode, a second drain, and a second source;
   a trench drain contact coupled to the first fin and the second fin, the trench drain contact including a drain contact top and a drain contact bottom; and
   a trench source contact coupled to the first fin and the second fin, the trench source contact including a source contact top and a source contact bottom;
   wherein the drain contact bottom is formed above the substrate and does not directly contact the substrate.

2. The non-planar transistor of claim 1, wherein the drain contact bottom is formed at or higher than the gate electrode top.

3. The non-planar transistor of claim 1, wherein the drain contact bottom is formed higher than the gate electrode bottom.

4. The non-planar transistor of claim 1, wherein between the first fin and the second fin an insulative material is formed between the drain contact bottom and the substrate.

5. The non-planar transistor of claim 1, wherein the source contact bottom is formed above the substrate and does not directly contacting the substrate.

6. The non-planar transistor of claim 1, wherein the entire drain contact bottom is planar.

7. The non-planar transistor of claim 1, wherein the drain contact top is formed higher than the gate electrode top.

8. The non-planar transistor of claim 1, wherein the first drain includes a first drain top and a first drain bottom, the first drain top being formed at or higher than the gate electrode top.

9. A method comprising:
   forming a gate electrode including a gate electrode top and a gate electrode bottom,
   coupling the gate electrode bottom to a substrate;
   coupling a first fin to the gate electrode, a first drain, and a first source;
   coupling a second fin to the gate electrode, a second drain, and a second source;
   coupling a first transistor terminal contact to the first fin and the second fin, the first transistor terminal contact including a first contact top and a first contact bottom; and
   coupling a second transistor terminal contact to the first fin and the second fin, the second transistor terminal contact including a second contact top and a second contact bottom; and
   forming the first contact bottom above the substrate and not directly contacting the substrate.

10. The method of claim 9, further comprising forming the first contact bottom at or higher than the gate electrode top.

11. The method of claim 9, further comprising forming, between the first fin and the second fin, an insulative material between the first contact bottom and the substrate.

12. The method of claim 9, further comprising forming the first contact bottom higher than the gate electrode bottom.

13. The method of claim 9, further comprising forming the first contact top higher than the gate electrode top.

14. The method of claim 9, further comprising forming a first drain top at or higher than the gate electrode top, the first drain including the first drain top and a first drain bottom.

15. The non-planar transistor of claim 1, wherein:
   the drain contact includes a portion extending the entire length of a dead space located between the first and second fins;
   the gate electrode includes a portion extending the entire length of the dead space;
   the entire top and bottom of the drain contact portion are both higher than any part of the gate electrode portion.

16. The non-planar transistor of claim 1, wherein the drain contact bottom lowers between the first and second fins and rises above the first and second fins.

17. The non-planar transistor of claim 1, wherein the drain contact bottom includes a first portion extending the entire length between the first and second fins and the entire first portion is higher than any portion of the gate electrode.

18. The non-planar transistor of claim 1, wherein
   the drain contact includes a portion extending the entire length of a dead space located between the first and second fins;
   the gate electrode includes a portion extending the entire length of the dead space;
   the entire top of the drain contact portion is higher than any part of the gate electrode portion,
   the entire bottom of the drain contact portion is lower than a part of the gate electrode portion.

19. The non-planar transistor of claim 1, wherein the drain contact bottom includes a first portion extending the entire length between the first and second fins and the entire first portion is planar.

20. The non-planar transistor of claim 1, wherein the trench drain contact directly connects to the first and second fins.

* * * * *